(12) United States Patent
Emoto et al.

(10) Patent No.: US 9,104,121 B2
(45) Date of Patent: Aug. 11, 2015

(54) EXPOSURE APPARATUS HAVING A VIBRATION SUPPRESSING FEATURE AND METHOD OF MANUFACTURING DEVICE USING THE EXPOSURE APPARATUS

(75) Inventors: Keiji Emoto, Saitama (JP); Tosiya Asano, Utsunomiya (JP)

(73) Assignee: CANON KABUSHIKI KAISHA (JP)

( * ) Notice: Subject to any disclaimer, the term of this patent is extended or adjusted under 35 U.S.C. 154(b) by 391 days.

(21) Appl. No.: 13/546,131

(22) Filed: Jul. 11, 2012

(65) Prior Publication Data

US 2013/0044306 A1 Feb. 21, 2013

(30) Foreign Application Priority Data

Aug. 15, 2011 (JP) ................................. 2011-177747

(51) Int. Cl.
*G03F 7/20* (2006.01)
*H01L 21/67* (2006.01)
*H01L 21/687* (2006.01)

(52) U.S. Cl.
CPC ........ *G03F 7/70725* (2013.01); *G03F 7/70766* (2013.01); *H01L 21/6719* (2013.01); *H01L 21/67288* (2013.01); *H01L 21/68785* (2013.01)

(58) Field of Classification Search
CPC .......................... G03F 7/70725; G03F 7/70766
USPC .......................................................... 355/72
See application file for complete search history.

(56) References Cited

U.S. PATENT DOCUMENTS

| | | | |
|---|---|---|---|
| 2002/0075467 A1 | 6/2002 | Tanaka et al. | |
| 2005/0041233 A1 | 2/2005 | Van Schothorst et al. | |
| 2006/0017908 A1* | 1/2006 | Mayama | 355/72 |
| 2009/0262325 A1* | 10/2009 | Butler et al. | 355/72 |

FOREIGN PATENT DOCUMENTS

| | | |
|---|---|---|
| JP | 2002-208562 A | 7/2002 |
| JP | 2005-109441 A | 4/2005 |

* cited by examiner

*Primary Examiner* — Peter B Kim
*Assistant Examiner* — Michelle Iacoletti
(74) *Attorney, Agent, or Firm* — Rossi, Kimms & McDowell LLP

(57) ABSTRACT

An exposure apparatus includes: a substrate stage configured to move upon holding the substrate; a structural member configured to support a substrate stage; a first counter mass stage configured to cancel a driving reaction force that is generated due to driving of the substrate stage and acts on the structural member; a substrate stage driver configured to generate a force between the substrate stage and the first counter mass stage; a first counter mass driver configured to generate a force between the structural member and the first counter mass stage; a controller configured to control the first counter mass driver so as to cancel the force that acts on the structural member by generating a force between the structural member and the first counter mass stage using the first counter mass driver.

6 Claims, 4 Drawing Sheets

EXPOSURE APPARATUS HAVING A VIBRATION SUPPRESSING FEATURE AND METHOD OF MANUFACTURING DEVICE USING THE EXPOSURE APPARATUS

BACKGROUND OF THE INVENTION

1. Field of the Invention

The present invention relates to an exposure apparatus and a method of manufacturing a device using the same.

2. Description of the Related Art

A scanning exposure apparatus which exposes a wafer to light while scanning a reticle and the wafer relative to an optical system is the current mainstream exposure apparatus serving as an apparatus for manufacturing a semiconductor device. To scan the reticle and wafer, a configuration including a reticle stage and wafer stage fixed on the same structural member has been proposed. The reticle and wafer are moved at a high acceleration by generating a force using a driver provided to each stage. A driving reaction force generated during the movement at a high acceleration acts on the structural member, and vibrates it. The structural member supports a reference plate on which a projection optical system is mounted through an anti-vibration apparatus, and its vibration leads to vibration of the reference plate and projection optical system and degrades the overlay accuracy in the exposure apparatus.

Hence, to minimize the driving reaction force transmitted from each stage to the structural member in the exposure apparatus, a technique associated with a counter mass mechanism which uses the law of conservation of momentum is often adopted, as described in Japanese Patent Laid-Open No. 2002-208562. The counter mass mechanism includes a counter mass stage which passively moves in the direction opposite to that in which the reticle stage or wafer stage moves, and makes ideally no driving force be transmitted from either of these stages to the structural member.

The counter mass mechanism will be described with reference to FIG. 3. A structural member 107 is supported on the floor through spring elements such as leveling blocks 124. The structural member 107 vertically supports a positioning stage 101 and a counter mass stage 103 using guides 151 such as static pressure bearings so that their horizontal friction can be ignored. A stage driver 115 which generates a force between the positioning stage 101 and the counter mass stage 103 is placed between them. The force generated by the stage driver 115 horizontally moves and positions the positioning stage 101. In this example, the positioning stage 101 and counter mass stage 103 have the same mass m. The center of gravity positions of the positioning stage 101 and counter mass stage 103, and the positions of the points of action of forces F generated by the stage driver 115 are aligned on one straight line in the moving direction. Also, to prevent the counter mass stage 103 from considerably deviating from an assumed position upon a tilt of the structural member 107, a counter mass driver 105 which generates a force between the counter mass stage 103 and the structural member 107 is placed between them. Ideally, there is no need to generate a force using the counter mass driver 105, and the position of the counter mass stage 103 is corrected by generating a force at an appropriate timing only when, for example, the counter mass stage 103 considerably deviates from a desired position.

In such a counter mass mechanism, when the stage driver 115 generates forces F, the counter mass stage 103 moves in the direction opposite to that in which the positioning stage 101 moves. Because the two stages have the same mass, they move at the same speed by the same distance. At this time, no disturbance forces due to the forces F generated by the stage driver 115 are input to the structural member 107, so the structural member 107 does not vibrate. Also, Japanese Patent Laid-Open No. 2005-109441 discloses a technique of providing a driver in a portion which supports the structural member so as to cancel disturbance forces input to the structural member.

Upon adopting an ideal counter mass mechanism, no disturbance forces are generated in the structural member 107 which supports the two stages 101 and 103, due to their driving reaction forces. However, an ideal counter mass mechanism often cannot be implemented due, for example, to design limits or processing variations, and this generates disturbance forces in the structural member 107 and vibrates the structural member 107.

The reason why the structural member 107 vibrates despite the adoption of a counter mass mechanism will be explained with reference to FIG. 4. FIG. 4 shows the same configuration as in FIG. 3 except that in the former the center of gravity positions of the positioning stage 101 and counter mass stage 103, and the positions of the points of action of forces F generated by the stage driver 115 are not aligned on one straight line in the moving direction. In this case as well, when the stage driver 115 generates forces F, the positioning stage 101 and counter mass stage 103 move in the opposite directions, so the forces generated by the stage driver 115 are not directly input to the structural member 107. However, the center of gravity position of the counter mass stage 103 deviates from the vertical positions of the points of action of the forces generated by the stage driver 115. Hence, a moment force M having an amount of deviation L as its arm length is generated in the counter mass stage 103 due to the forces F. The moment force M is transmitted to the structural member 107 through the guides 151 and vibrates it in the rotation direction.

This means that to prevent generation of forces input from the stage driver 115 to the structural member 107, it is necessary to vertically match the center of gravity position of each stage with the positions of the points of action of the forces. However, the center of gravity positions and the points of actions often deviate from each other on the order of several millimeters due, for example, to design limits or variations among components. As the performance specifications of an exposure apparatus become stricter, it becomes harder in practice to make vibration of the structural member 107 fall within a tolerance even when a moment force is generated due to a deviation on the order of several millimeters upon generation of a force of 1,000 N or more by the stage driver 115. Under the circumstances, various approaches are made to improve the design or reduce processing variations so as to implement a counter mass mechanism closer to an ideal one. On the other hand, it is desired to suppress vibration of the structural member 107 by canceling disturbance forces generated in the structural member 107 which supports the two stages 101 and 103.

Further, various disturbance forces other than those due to factors associated with the configuration of the counter mass mechanism are assumed to be generated in the structural member on the exposure apparatus. Examples of the assumed disturbance forces include a disturbance force generated by mounted components connected to each stage with stage movement, that due to factors associated with various drivers placed on the structural member, and that due, for example, to floor vibration, and a vibration suppression system which damps these disturbance forces is required. As a method of canceling disturbance forces input to the structural member 107 which supports the stages 101 and 105, a configuration including a dedicated driver has been proposed but poses problems resulting from the installation space and cost of the driver, as disclosed in Japanese Patent Laid-Open No. 2005-109441.

SUMMARY OF THE INVENTION

The present invention provides an exposure apparatus which effectively suppresses vibration of a structural member.

The present invention provides an exposure apparatus which projects a pattern of a reticle onto a substrate to expose the substrate to light, the apparatus comprising: a substrate stage configured to move upon holding the substrate; a reticle stage configured to move upon holding the reticle; a structural member configured to support the substrate stage and the reticle stage; a first counter mass stage supported by the structural member, and configured to cancel a driving reaction force that is generated due to driving of the substrate stage and acts on the structural member; a second counter mass stage supported by the structural member, and configured to cancel a driving reaction force that is generated due to driving of the reticle stage and acts on the structural member; a substrate stage driver configured to generate a force between the substrate stage and the first counter mass stage; a reticle stage driver configured to generate a force between the reticle stage and the second counter mass stage; a first counter mass driver configured to generate a force between the structural member and the first counter mass stage; a second counter mass driver configured to generate a force between the structural member and the second counter mass stage; and a controller configured to obtain information of a force that acts on the structural member, and to control the first counter mass driver and the second counter mass driver so as to cancel the force that acts on the structural member by simultaneously generating a force between the structural member and the first counter mass stage using the first counter mass driver, and a force between the structural member and the second counter mass stage using the second counter mass driver.

Further features of the present invention will become apparent from the following description of exemplary embodiments with reference to the attached drawings.

DESCRIPTION OF THE EMBODIMENTS

[First Embodiment]

Figure 1:
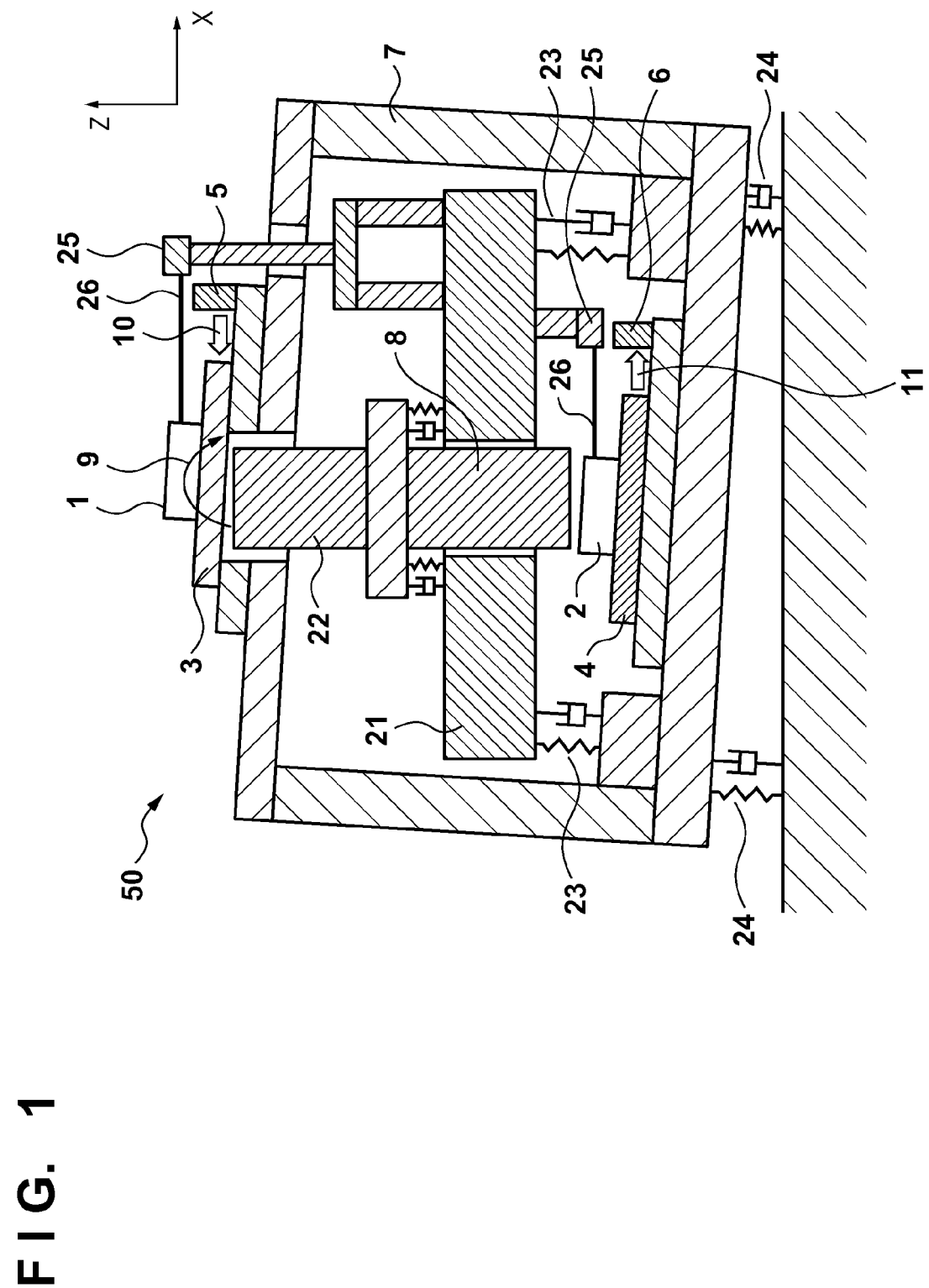
FIG. 1 is a view showing the configuration of an exposure apparatus in the first embodiment.

FIG. 1 is a view schematically showing a scanning exposure apparatus which projects the pattern of a reticle onto a substrate to expose the substrate to light. In an exposure apparatus 50 of this embodiment, a wafer stage (substrate stage) 2 which moves upon holding a wafer (substrate), and a reticle stage 1 which moves upon holding a reticle are supported by the same structural member 7. Also, the wafer stage 2 and reticle stage 1 are provided with counter mass mechanisms to be described hereinafter. A first counter mass stage 4 which cancels a driving reaction force which is generated due to driving of the wafer stage 2 and acts on the structural member 7 is supported by the structural member 7. Further, the exposure apparatus 50 is provided with a substrate stage driver 40 (see wafer stage driver in FIG. 2) which generates a force between the wafer stage 2 and the first counter mass stage 4, and a first counter mass driver 6 which generates a force between the first counter mass stage 4 and the structural member 7.

Similarly, a second counter mass stage 3 which cancels a driving reaction force which is generated due to driving of the reticle stage 1 and acts on the structural member 7 is supported by the structural member 7. Further, the exposure apparatus 50 is provided with a reticle stage driver 41 (see FIG. 2) which generates a force between the reticle stage 1 and the second counter mass stage 3, and a second counter mass driver 5 which generates a force between the second counter mass stage 3 and the structural member 7. The wafer stage driver 40, reticle stage driver 41, first counter mass driver 6, and second counter mass driver 5 can be implemented by electromagnetic actuators which use, for example, Lorentz forces.

The structural member 7 is fixed on the floor through spring and damper elements such as leveling blocks 24. Also, a reference plate 21 is placed on the structural member 7 through an anti-vibration apparatus 23 having low spring stiffness, and a lens barrel 22 including a projection optical system is supported on the reference plate 21. An interferometer 25 is placed on the reference plate 21, and measures the positions of the wafer stage 2 and reticle stage 1 through an interferometer laser 26. Since a change in orientation and elastic deformation of the exposure apparatus 50 due to vibration of the lens barrel 22 and reference plate 21 influence the exposure performance of the exposure apparatus 50, the exposure apparatus 50 is designed to minimize the vibration of the lens barrel 22 and reference plate 21. The lens barrel 22 and reference plate 21 are based on the design concept that they are vibrationally insulated from the structural member 7 by the anti-vibration apparatus 23 to a certain degree. However, as the exposure performance specifications become stricter, it becomes more necessary to minimize vibration of the structural member 7 as well.

A technique of suppressing vibration of the structural member 7 when forces (disturbance forces) which act on the structural member 7, such as a moment force 9, are generated in the structural member 7 will be described next with reference to FIGS. 1 and 2. The present invention defines the disturbance forces as forces other than controlling forces, which are input from the first counter mass driver 6 and second counter mass driver 5 to the structural member 7. Examples of the disturbance forces which act on the structural member 7 include forces generated upon driving of stage portions mounted on the structural member 7, such as the reticle stage 1, wafer stage 2, second counter mass stage 3, and first counter mass stage 4. The disturbance forces defined in the present invention also include forces input to the structural member 7 through, for example, the leveling blocks 24 upon floor vibration. Also, the controlling forces mean herein forces generated in the structural member 7 by the first counter mass driver 6 and second counter mass driver 5 so as to damp vibration of the structural member 7, based on the present invention.

If the center of gravity position of the second counter mass stage 3 and the point of action of a driving force generated by the reticle stage driver 41 in the vertical direction deviate from each other, a disturbance force (moment force) 9 is generated in the structural member 7 upon driving of the reticle stage 1.

This rotates the structural member 7 about the Y-axis under normal circumstances and vibrates it. Hence, forces 11 and 10 are simultaneously generated between the structural member 7 and the first counter mass stage 4 and second counter mass stage 3, respectively, by the first counter mass driver 6 and second counter mass driver 5 in correspondence with the disturbance force (moment force) 9.

In this case, let M be the disturbance force (moment force) 9 generated by the counter mass mechanism, and L be the amount of position deviation between the center of gravity position of the second counter mass stage 3 and the point of action of a force generated by the reticle stage driver 41 in the vertical direction. Also, let F be the force generated by the reticle stage driver 41. Then, the moment force M, the amount of position deviation L, and the force F satisfy:

$$M = F \times L \quad (1)$$

In correspondence with this equation, controlling forces generated by the first counter mass driver 6 and second counter mass driver 5 are calculated in the following way. Referring to FIG. 1, let F1 and F2 be the controlling forces in the X-direction generated by the first counter mass driver 6 and second counter mass driver 5. Also, let L1 be the vertical (Z-direction) distance between the center of gravity 8 of the entire configuration including the structural member 7 and components (for example, the components 1 to 6 shown in FIG. 1) which are mounted on the structural member 7 and perform a rigid motion almost together, and the position of the point of action of the controlling force F1 generated by the first counter mass driver 6. Note that the center of gravity 8 can be defined as various centers of gravity in consideration of the calculation accuracy of a disturbance force to be obtained, and may be defined as that of the entire apparatus including the reference plate 21 and lens barrel 22. Similarly, let L2 be the vertical (Z-direction) distance between the center of gravity 8 of the entire apparatus and the position of the point of action of the controlling force F2 generated by the second counter mass driver 5. Moreover, let M be the disturbance force (moment force) 9 generated upon driving of the reticle stage 1. Then, the controlling forces F1 and F2, the distances L1 and L2, and the moment force M satisfy:

$$F1 + F2 = 0 \quad (2)$$

$$F1 \times L1 + F2 \times L2 = Mtm \quad (3)$$

From these two equations, the controlling forces F1 and F2 are respectively given by:

$$F1 = M/(L1-L2) \quad (4)$$

$$F2 = -M/(L1-L2) \quad (5)$$

When the first counter mass driver 6 and second counter mass driver 5 generate the controlling forces F1 and F2, it is possible to generate a force which cancels only the disturbance force (moment force) 9 acting on the structural member 7. In this way, the occurrence of vibration of the structural member 7 can be suppressed to, in turn, suppress vibration of the lens barrel 22 and reference plate 21 placed on the structural member 7, thereby improving the exposure performance of the exposure apparatus 50. Although a method of canceling only the disturbance force (moment force) 9 generated upon driving of the reticle stage 1 has been described above, a disturbance force (moment force) generated upon driving of the wafer stage 2 can similarly be canceled.

Figure 2:
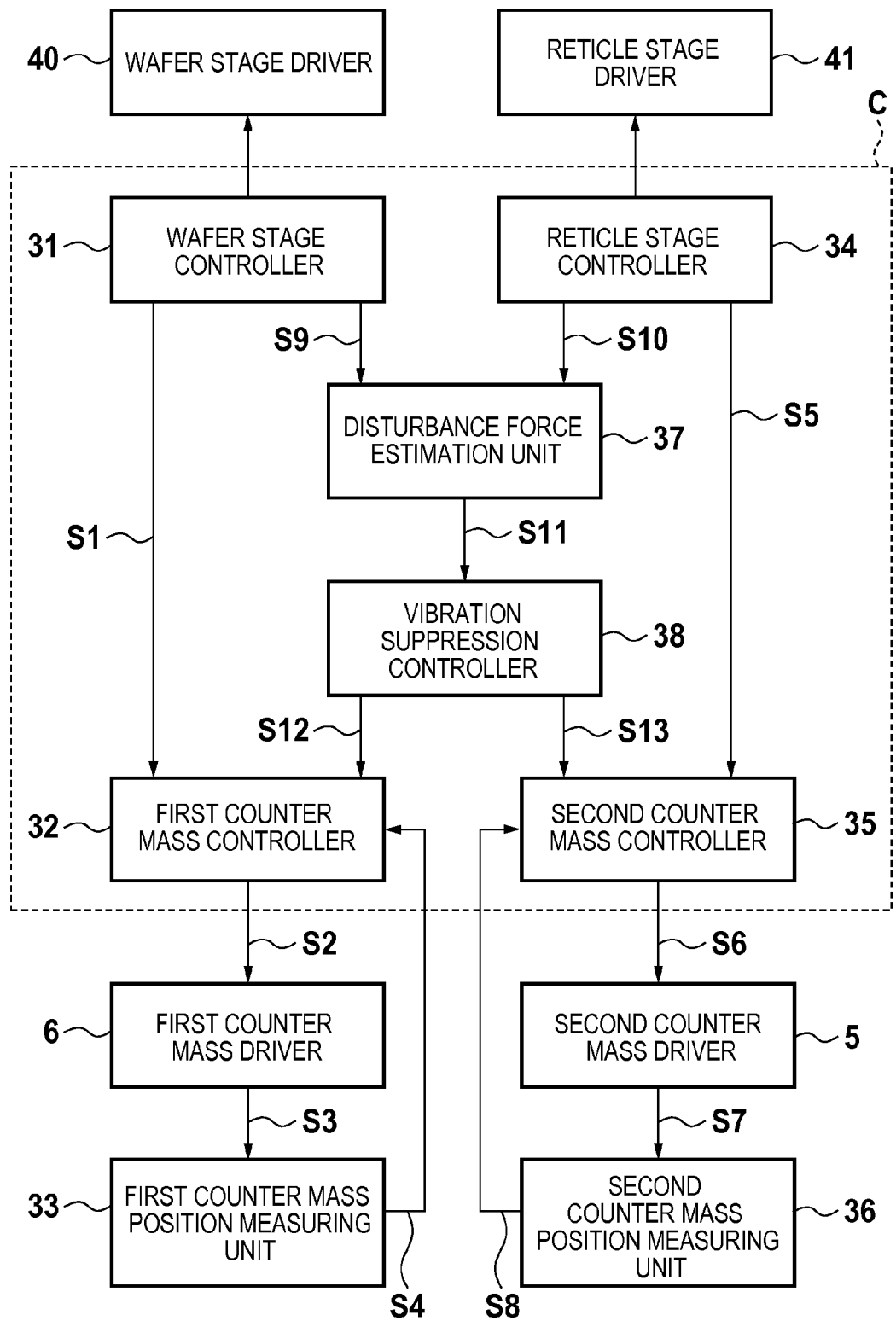
FIG. 2 is a block diagram showing the flow of information in the first embodiment.
Figure 3:
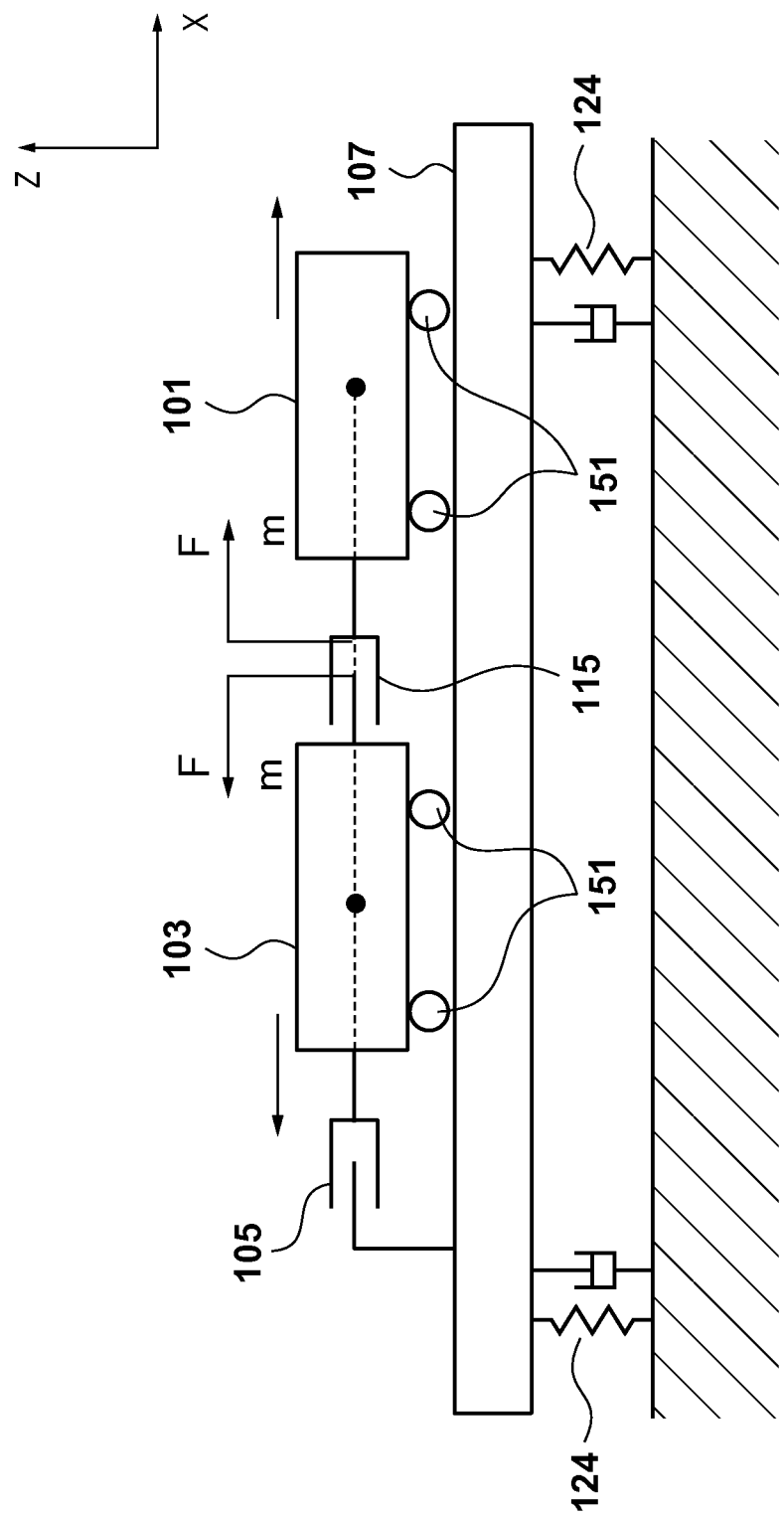
FIG. 3 is a view showing the outline of a counter mass mechanism.
Figure 4:
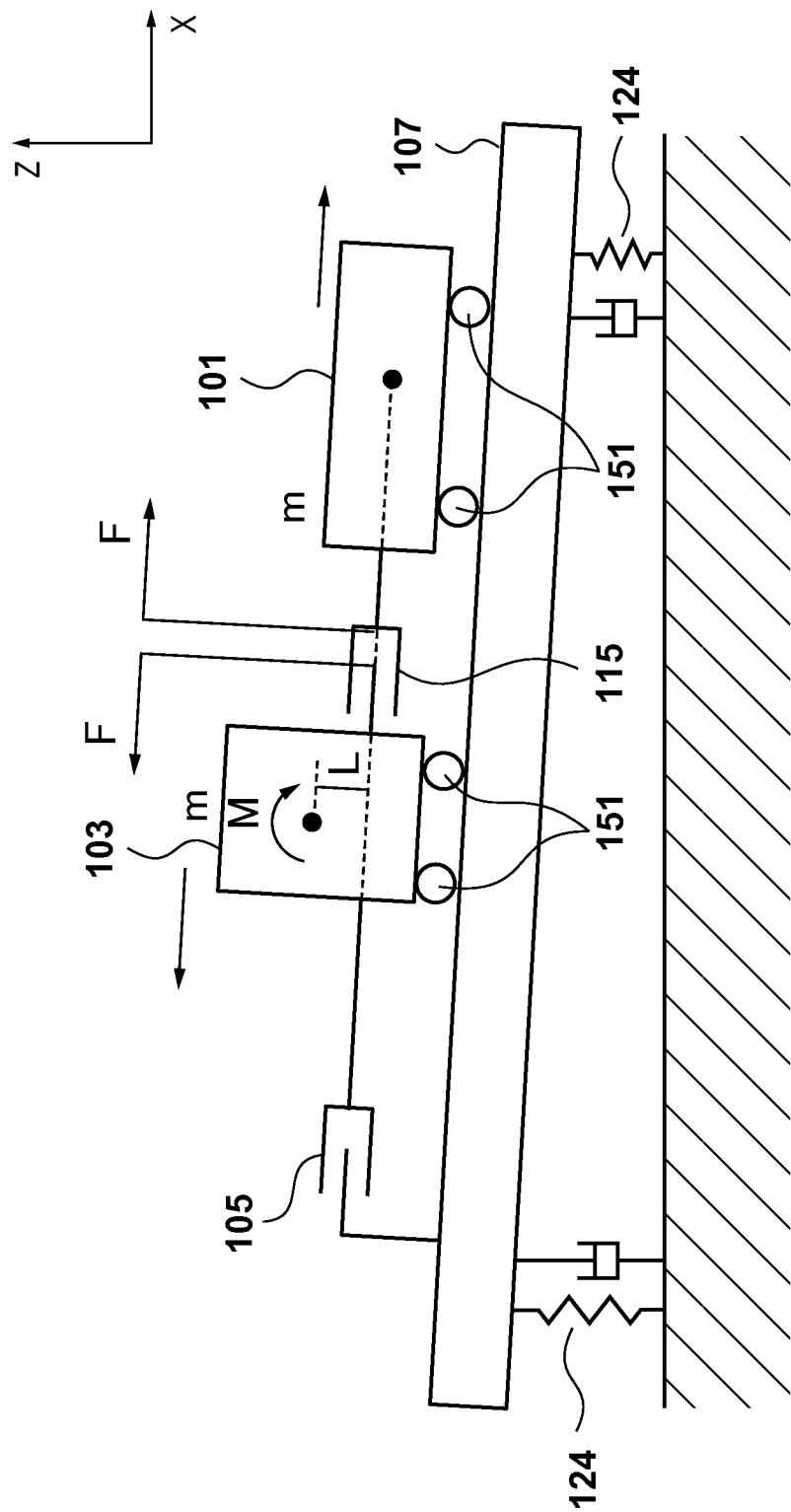
FIG. 4 is a view illustrating an example in which the counter mass mechanism generates a moment force.

FIG. 2 shows the flow of information in the counter mass mechanism. A wafer stage controller 31 controls driving of the wafer stage 2 to determine a controlling force that allows the wafer stage driver 40 which generates a force between the wafer stage 2 and the first counter mass stage 4 to position the wafer. Controlling force information S1 of the determined controlling force is transmitted to a first counter mass controller 32. The first counter mass controller 32 determines the controlling force F1 to be applied to the first counter mass stage 4, based on the controlling force information S1, position information S4 of the first counter mass stage 4, and controlling force information S12 (to be described later) sent from a vibration suppression controller 38 to the structural member 7. A determined controlling force command S2 is transmitted to the first counter mass driver 6 to generate the controlling force F1 between the first counter mass stage 4 and the structural member 7. Upon this operation, the first counter mass stage 4 performs desired movement. The amount of movement of the first counter mass stage 4 is measured by a first counter mass position measuring unit 33 such as a displacement sensor, and its position information S4 is transmitted to the first counter mass controller 32. The counter mass mechanism on the reticle side also controls movement of the second counter mass stage 3 while pieces of information S5 to S8 are transmitted in the same flow.

In the present invention, pieces of controlling force information S9 and S10 sent from the wafer stage controller 31 and a reticle stage controller 34 to the corresponding stages are transmitted to a disturbance force estimation unit 37, and the disturbance force (moment force) 9 input to the structural member 7 is calculated in accordance with the above-mentioned equation (1), thereby obtaining disturbance force information S11. The obtained disturbance force information S11 is transmitted to the vibration suppression controller 38. The vibration suppression controller 38 calculates the controlling forces F1 and F2, to be generated by the first and second counter mass drivers 6 and 5, in accordance with equations (4) and (5), and transmits pieces of controlling force information S12 and S13 to the first counter mass controller 32 and a second counter mass controller 35. In the related art techniques, the first counter mass stage 4 and second counter mass stage 3 are independently controlled in correspondence with the wafer stage 2 and reticle stage 1. However, the present invention is different from the related art techniques in that in the former forces are generated by the first counter mass driver 6 and second counter mass driver 5 while they are synchronized with each other so as to damp vibration of the structural member 7. Upon this operation, the disturbance force (moment force) 9 generated in the structural member 7 upon driving of one or both of the reticle stage 1 and wafer stage 2 can be efficiently canceled without providing a new driver. The wafer stage controller 31, reticle stage controller 34, first and second counter mass controllers 32 and 35, disturbance force estimation unit 37, and vibration suppression controller 38 constitute a controller C.

Although the disturbance force estimation unit 37 obtains a disturbance force by calculation using equation (1) in the example described in this embodiment, the present invention is not limited to this, and other theoretical equations may be used, or a disturbance force may be estimated using a relation obtained by experiments. Also, although the vibration suppression controller 38 determines the controlling forces F1 and F2, to be generated by the first counter mass driver 6 and second counter mass driver 5, in accordance with equations (4) and (5) in the above-mentioned example, the controlling force information S12 and S13 for the drivers 6 and 5 may be determined using other theoretical or empirical equations.

[Second Embodiment]

A technique of suppressing vibration of the structural member 7 due to the moment force 9 upon driving of the reticle stage 1 has been described in the first embodiment, but a force which cancels a disturbance force including not only a moment force but also a translational force (a force in the X-direction in the case of FIG. 1) can be generated. For example, a large number of mounting members such as wires and pipes are often routed between a reticle stage 1 and a structural member 7. In this case, as the reticle stage 1 moves in the X-direction, a translational force in the X-direction is sometimes transmitted to the structural member 7 through the mounting members. If a considerable friction force acts between the reticle stage 1 and the structural member 7, a translational force also acts on the structural member 7 as the reticle stage 1 moves in the X-direction. In this case, a translational force F3 is input to the structural member 7 simultaneously with input of a moment force M to the structural member 7 upon driving of the reticle stage 1.

In such a case, it is possible to estimate the translational force F3 in accordance with a theoretical equation, but a disturbance force estimation unit 37 normally estimates the translational force F3 using an empirical relation derived in advance. Also, a vibration suppression controller 38 determines controlling forces F1 and F2 for first and second counter mass drivers 6 and 5 in accordance with force equilibrium equations in the structural member 7 in correspondence with equations (2) and (3) as:

$$F1+F2=F3 \qquad (6)$$

$$F1 \times L1 + F2 \times L2 = M \qquad (7)$$

From these two equations, the controlling forces F1 and F2 are respectively given by:

$$F1=(M-F3\times L2)/(L1-L2) \qquad (8)$$

$$F2=-(M-F3\times L2)/(L1-L2) \qquad (9)$$

Although the moment force M and translational force F3 are generated upon driving of the reticle stage 1 as disturbance forces which act on the structural member 7 in the above-mentioned example, a moment force M or translational force F3 generated upon driving of a wafer stage 2 can similarly be canceled.

[Third Embodiment]

Disturbance forces which are generated by the reticle stage 1 and wafer stage 2 and act on the structural member 7 are canceled in the first and second embodiments. However, disturbance forces generated by other drivers placed on a structural member 7 may be canceled. For example, an exposure apparatus 50 often includes a driver which is driven in synchronism with driving of a reticle stage 1 and is called a masking blade that limits the reticle illumination range. In this case, the driving reaction force of the masking blade may be input to the structural member 7 as a disturbance force (moment force or translational force). If the disturbance force which is generated by such a driver and acts on the structural member 7 is a moment about the Y-axis or a translational force in the X-direction in FIG. 1, it can be canceled by a vibration suppression controller 38, as described in the first and second embodiments. However, in this case, the relationship between the driving information of the driver targeted by a disturbance force estimation unit 37 and the disturbance force which acts on the structural member 7 must be obtained by a theoretical or empirical equation in advance so that the disturbance force which acts on the structural member 7 can be estimated based on the driving information of the driver.

[Fourth Embodiment]

Although the disturbance force estimation unit 37 estimates a disturbance force which acts on the structural member 7, and the vibration suppression controller 38 calculates, based on the estimated disturbance force, a canceling force to be applied to the structural member 7, thereby suppressing vibration of the structural member 7 in the examples described in the first to third embodiments, the present invention is not limited to these examples. For example, a detector which detects vibration of, for example, an acceleration sensor, a displacement sensor, or a velocity sensor may be placed on a structural member 7 to directly suppress vibration of the structural member 7 based on the detection result, instead of estimating a disturbance force which acts on the structural member 7. Based on the detection result obtained by the detector, a vibration suppression controller 38 adjusts forces generated by first and second counter mass drivers 6 and 5 so as to suppress vibration of the structural member 7. In this case, a method of adjusting forces generated by the first and second counter mass drivers 6 and 5 is calculated by experiments in advance. With such a configuration, vibration of the structural member 7 can be suppressed even if the cause of generation of a disturbance force cannot be identified clearly. It is also possible to efficiently cancel a random disturbance force which acts on the structural member 7 due to floor vibration.

[Method of Manufacturing Device]

A method of manufacturing a device (for example, a semiconductor device or a liquid crystal display device) will be described next. A semiconductor device is manufactured by a preprocess of forming an integrated circuit on a wafer, and a post-process of completing, as a product, a chip of the integrated circuit formed on the wafer by the preprocess. The preprocess includes a step of exposing a wafer coated with a photosensitive agent to light using the above-mentioned exposure apparatus, and a step of developing the wafer. The post-process includes an assembly step (dicing and bonding) and packaging step (encapsulation). A liquid crystal display device is manufactured by a step of forming a transparent electrode. The step of forming a transparent electrode includes a step of coating a photosensitive agent on a glass substrate on which a transparent conductive film is deposited, a step of exposing the glass substrate coated with the photosensitive agent to light using the above-mentioned exposure apparatus, and a step of developing the glass substrate. The method of manufacturing a device according to this embodiment can manufacture a device with a quality higher than those of devices manufactured by the related art techniques.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-177747 filed Aug. 15, 2011, which is hereby incorporated by reference herein in its entirety.

What is claimed is:

1. An exposure apparatus for projecting a pattern of a reticle onto a substrate to expose the substrate to light, the exposure apparatus comprising:
 a substrate stage configured to move while holding the substrate;
 a reticle stage configured to move while holding the reticle;
 a structural member configured to support said substrate stage and said reticle stage;
 a first counter mass stage supported by said structural member;
 a second counter mass stage supported by said structural member;

a substrate stage driver configured to generate a first force between said substrate stage and said first counter mass stage;
a reticle stage driver configured to generate a second force between said reticle stage and said second counter mass stage;
a first counter mass driver configured to generate a third force between said structural member and said first counter mass stage;
a second counter mass driver configured to generate a fourth force between said structural member and said second counter mass stage; and
a controller configured to:
calculate a total force, including the first force and the second force, that acts on said structural member; and
control said first counter mass driver and said second counter mass driver to cancel the total force that acts on said structural member by simultaneously generating the third force using said first counter mass driver and the fourth force using said second counter mass driver.

2. The apparatus according to claim 1, wherein said controller calculates the total force that acts on said structural member based on driving information of a plurality of drivers, including said substrate stage and said reticle stage, each of which is supported by said structural member, that generate the total forces that act on said structural member.

3. The apparatus according to claim 2, wherein the plurality of drivers include a driver for a masking blade that limits an illumination range of the reticle in addition to said substrate stage driver and said reticle stage driver.

4. The apparatus according to claim 2, wherein said controller calculates the total force that acts on said structural member based on a moment generated upon a position deviation between the center of gravity of said first counter mass stage and a point of action of the first force on said first counter mass stage, and a moment generated upon a position deviation between the center of gravity of said second counter mass stage and a point of action of the second force on said second counter mass stage.

5. The apparatus according to claim 1, further comprising:
a detector placed on said structural member and configured to detect vibration of said structural member,
wherein said controller calculates the force that acts on said structural member based on the detection result obtained by said detector.

6. A method of manufacturing a device, the method comprising:
exposing a substrate using an exposure apparatus for projecting a pattern of a reticle onto a substrate to expose the substrate;
developing the exposed substrate; and
processing the developed substrate to manufacture the device,
wherein the exposure apparatus includes:
a substrate stage configured to move while holding the substrate;
a reticle stage configured to move while holding the reticle;
a structural member configured to support the substrate stage and the reticle stage;
a first counter mass stage supported by the structural member;
a second counter mass stage supported by the structural member;
a substrate stage driver configured to generate a first force between the substrate stage and the first counter mass stage;
a reticle stage driver configured to generate a second force between the reticle stage and the second counter mass stage;
a first counter mass driver configured to generate a third force between the structural member and the first counter mass stage;
a second counter mass driver configured to generate a fourth force between the structural member and the second counter mass stage; and
a controller configured to:
calculate a total force, including the first force and the second force, that act on the structural member; and
control the first counter mass driver and the second counter mass driver to cancel the total force that acts on the structural member by simultaneously generating the third force using the first counter mass driver and the fourth force using the second counter mass driver.

* * * * *